US011750206B2

(12) United States Patent
Ding et al.

(10) Patent No.: US 11,750,206 B2
(45) Date of Patent: Sep. 5, 2023

(54) SYSTEM AND METHOD FOR ANALOG-TO-DIGITAL SIGNAL CONVERSION

(71) Applicant: Stichting IMEC Nederland, Eindhoven (NL)

(72) Inventors: Ming Ding, Eindhoven (NL); Martijn Timmermans, Eindhoven (NL); Pieter Harpe, Waalre (NL)

(73) Assignee: Stichting IMEC Nederland, Eindhoven (NL)

( * ) Notice: Subject to any disclaimer, the term of this patent is extended or adjusted under 35 U.S.C. 154(b) by 70 days.

(21) Appl. No.: 17/563,635

(22) Filed: Dec. 28, 2021

(65) Prior Publication Data

US 2022/0216879 A1 Jul. 7, 2022

(30) Foreign Application Priority Data

Jan. 4, 2021 (EP) ..................... 21150013

(51) Int. Cl.
 *H03M 1/10* (2006.01)
(52) U.S. Cl.
 CPC ................. *H03M 1/1014* (2013.01)
(58) Field of Classification Search
 CPC ............ H03M 1/06; H03M 1/50; H03M 1/12; H03M 1/1014; H03M 1/125; H03M 1/0614
See application file for complete search history.

(56) References Cited

U.S. PATENT DOCUMENTS 6,353,404 B1 * 3/2002 Kuroiwa ................. H03M 1/70
    341/139
6,492,929 B1 * 12/2002 Coffey .................. H03M 1/127
    341/123

(Continued)

OTHER PUBLICATIONS

Extended European Search Report and Written Opinion, Application No. EP21150013.7, dated Jun. 23, 2021, 10 pages.

(Continued)

*Primary Examiner* — Lam T Mai
(74) *Attorney, Agent, or Firm* — McDonnell Boehnen Hulbert & Berghoff LLP

(57) ABSTRACT

Example embodiments relate to systems and methods for analog-to-digital signal conversion. One embodiment includes a system for analog-to-digital signal conversion. The system includes an analog input signal. The system also includes a digital-to-analog converter configured to generate a reference signal. Further, the system includes an amplifier configured to amplify an error signal that includes a difference between the analog input signal and the reference signal. Additionally, the system includes a level-crossing based sampling circuit that includes a first comparator configured to compare the error signal with respect to a first reference level, and a second comparator configured to compare the error signal with respect to a second reference level, thereby generating event-based reset signals corresponding to a plurality of sampling instances in order to reset the digital-to-analog converter. Yet further, the system includes a trigger circuit configured to generate reset signals asynchronous to the event-based reset signals.

20 Claims, 8 Drawing Sheets

(56) References Cited

U.S. PATENT DOCUMENTS

| | | | | |
|---|---|---|---|---|
| 8,604,861 | B1* | 12/2013 | Ceballos | G06G 7/18 |
| | | | | 327/337 |
| 8,606,051 | B2* | 12/2013 | Wang | H04N 25/75 |
| | | | | 341/169 |
| 9,252,658 | B2 | 2/2016 | Lee et al. | |
| 10,061,272 | B2* | 8/2018 | Chiu | H03M 1/1245 |
| 2002/0180626 | A1* | 12/2002 | Sasaki | H03M 1/108 |
| | | | | 341/120 |
| 2005/0140433 | A1* | 6/2005 | Maloberti | H03F 3/45977 |
| | | | | 330/9 |
| 2007/0222483 | A1 | 9/2007 | Lee | |
| 2013/0083951 | A1* | 4/2013 | Majidzadeh Bafar | |
| | | | | H04R 25/505 |
| | | | | 341/155 |
| 2015/0263606 | A1* | 9/2015 | Lee | G11C 27/024 |
| | | | | 323/235 |
| 2016/0065229 | A1* | 3/2016 | Kull | H03M 1/002 |
| | | | | 341/172 |
| 2017/0237268 | A1* | 8/2017 | Brannick | H03M 1/52 |
| | | | | 378/91 |
| 2017/0357219 | A1* | 12/2017 | Chiu | H03M 1/1245 |
| 2020/0160186 | A1 | 5/2020 | Lesso et al. | |
| 2021/0376844 | A1* | 12/2021 | Wang | H03M 1/1265 |

OTHER PUBLICATIONS

Weltin-Wu, Colin, and Yannis Tsividis. "An event-driven clockless level-crossing ADC with signal-dependent adaptive resolution." IEEE Journal of Solid-State Circuits 48, No. 9 (2013): 2180-2190.

Ravanshad, Nassim, Hamidreza Rezaee-Dehsorkh, and Reza Lotfi. "A fully-synchronous offset-insensitive level-crossing analog-to-digital converter." In 2016 IEEE 59th International Midwest Symposium on Circuits and Systems (MWSCAS), pp. 1-4. IEEE, 2016.

Trakimas, Michael, and Sameer Sonkusale. "A 0.8 V asynchronous ADC for energy constrained sensing applications." In 2008 IEEE Custom Integrated Circuits Conference, pp. 173-176. IEEE, 2008.

Teman, Adam, Pascal Meinerzhagen, Robert Giterman, Alexander Fish, and Andreas Burg. "Replica technique for adaptive refresh timing of gain-cell-embedded DRAM." IEEE Transactions on Circuits and Systems II: Express Briefs 61, No. 4 (2014): 259-263.

* cited by examiner

SYSTEM AND METHOD FOR ANALOG-TO-DIGITAL SIGNAL CONVERSION

CROSS-REFERENCE TO RELATED APPLICATIONS

The present application is a non-provisional patent application claiming priority to European Patent Application No. EP 21150013.7, filed Jan. 4, 2021, the contents of which are hereby incorporated by reference.

FIELD OF THE DISCLOSURE

The disclosure relates to analog-to-digital signal conversion, especially to asynchronous analog-to-spike converter architectures in wireless sensor nodes.

BACKGROUND

Generally, minimizing power consumption in wireless sensor nodes is important to ensure a long lifetime of the battery. One way to minimize the power consumption is by making the power consumption activity dependent. For many biological signals, such as ECG, EEG, neuron signals, only small pieces in time are important to process. This reduced data helps, for example, the transmitter, since it now may transmit less data and thus uses less power. Since the transmitter power consumption is usually much higher than other components such as the front-end, reducing the power of the transmitter has a significant impact on the total power consumption.

For a continuous monitoring system, the analog information is continuously monitored by a front-end, then converted by an analog-to-digital converter (ADC), and then sent out via a transmitter. Conventionally, an ADC samples the signal at every clock pulse, which is independent of the input signal. This means that even when the signal does not change, samples are still being generated. A different way of sampling is called level-crossing sampling, where a sampling instance occurs, i.e. the generation of a sample, only when the amplitude of the signal changed by a fixed step. The patent document U.S. Pat. No. 9,252,658 B2 shows such level-crossing based sampling, for instance.

Usually, two different comparators are used to compare against the reference level just above and below the signal level. However, the input referred offset of the comparators directly affects the achievable signal-to-noise-and-distortion ratio (SNDR). This means that to achieve high SNDR (e.g. >60 dB), the offset of the comparator should be kept low. Additionally, for low frequency, high SNR applications, the area of a level-crossing ADC can increase. This is due to the leakage in typical CMOS technologies. To meet the long hold time of the digital-to-analog converter (DAC) for low frequency signals, larger capacitors may be used. The increased area size can become a problem when, for instance, thousands of channels in the human body may be used to measure bio signals.

SUMMARY

Accordingly, the disclosure and the claims provide a system and a method for analog-to-digital signal conversion, which can address the above-mentioned limitations.

According to a first aspect of the disclosure, a system for analog-to-digital signal conversion is provided. The system comprises an analog input signal, a digital-to-analog converter configured to generate a reference signal, and an amplifier configured to amplify an error signal comprising a difference between the analog input signal and the reference signal. The system further comprises a level-crossing based sampling circuit comprising a first comparator configured to compare the error signal with respect to a first reference level, and a second comparator configured to compare the error signal with respect to a second reference level, thereby generating event-based reset signals corresponding to a plurality of sampling instances in order to reset the digital-to-analog converter and further to shift the first reference level and the second reference level through the digital-to-analog converter. Moreover, the system comprises a trigger circuit configured to generate reset signals asynchronous to the event-based reset signals in order to reset the digital-to-analog converter.

Therefore, the disclosure provides additional resets for resetting the DAC in addition to the event-based resets correspond to each sampling instances, i.e. to each instance of sample generation. The event-based reset signals or spikes reset the DAC and further change the reference signal level (e.g. voltage level) through the DAC, especially by shifting the first reference level and the second reference level via the DAC. Furthermore, the resets are not clock-generated so as to eliminate the necessity of having on-board oscillators.

Consequently, capacitors with increased area that are used for the DAC are not required even if the signal changes slowly, since the additional resets minimize the requirements for a longer hold time. Moreover, the amplifier, or a so-called pre-amplifier, shared by the comparators includes sufficient area for the calibration of the comparators. Any error made after the pre-amplifier is divided by the gain of the pre-amplifier, thereby relaxing the offset requirement of the comparators.

In some embodiments, the level-crossing based sampling circuit further includes a digital logic circuit configured to generate an amplitude and a time stamp corresponding to each of the plurality of sampling instances. In addition, the digital logic circuit is further configured to feedback the amplitude corresponding to each of the plurality of sampling instances to the digital-to-analog converter in order to generate the reference signal. In this regard, the digital logic circuit may comprise an up/down counter that functions as a digital integrator and a timer that records the time in-between two sampling instances or samples. For each sampling instances, the output of the comparators toggles and the digital logic circuit starts to update the up/down counter to refresh the comparison window.

In some embodiments, the digital-to-analog converter is a capacitive charge transfer digital-to-analog converter (e.g., a switched capacitor based digital-to-analog converter). In this regard, the trigger circuit comprises a switched capacitor arrangement in order to replicate the digital-to-analog converter. The use of capacitive DAC for reference signal or voltage generation may facilitate smaller area and low power consumption. Moreover, by replicating the DAC, e.g. replicating the switched-capacitor arrangement of the DAC, the leakage induced error of the DAC can be potentially measured during operation.

In some embodiments, the level-crossing based sampling circuit further comprises a first capacitor bank coupled between a common node downstream to the amplifier and the first comparator, where the first capacitor bank is configured to store the first reference level based on the reference signal. In addition, the level-crossing based sampling circuit further comprises a second capacitor bank coupled between the common node downstream to the amplifier and the second comparator, where the second capacitor bank is configured to store the second reference level based on the reference signal.

In some embodiments, only one pre-amplifier is used to store the reference levels, i.e. two references that are two LSB apart, in order to compare the input signal against the reference levels. This can further reduce the overall area of the ADC in addition to input referred offset compensation for the comparators.

In some embodiments, the first capacitor bank and/or the second capacitor bank comprises a pair of parallel capacitors and switching arrangements. In this context, the switching arrangements are configured to be operable such that at least one capacitor of the pair of parallel capacitors stores a charge proportional to two least significant bit (LSB) in addition to an offset error of the amplifier. Furthermore, the switching arrangements are configured to be operable such that at least one capacitor of the pair of parallel capacitors stores a charge proportional to the offset error of the amplifier. Moreover, the switching arrangements are configured to be operable such that the pair of parallel capacitors each store a charge proportional to one least significant bit (LSB). This effectively provides two references that are two LSB apart for the ADC to compare the input signal against the references.

In some embodiments, the pair of parallel capacitors of the first capacitor bank and/or the second capacitor bank are equal in dimension (e.g., identical parallel plate capacitors). Additionally, the digital logic circuit may be configured to generate control signals for the switching arrangements of the first capacitor bank and/or the second capacitor bank. This may provide a straightforward arrangement for storing the references.

According to a second aspect of the disclosure, a method for signal conversion is provided in a system for analog-to-digital signal conversion. The method comprises the step of providing an analog input signal. The method further comprises the step of generating a reference signal by a digital-to-analog converter. In addition, the method comprises the step of generating an error signal comprising a difference between the analog input signal and the reference signal and amplifying the error signal by an amplifier. Furthermore, the method comprises the step of comparing the error signal with respect to a first reference level and a second reference level and generating event-based reset signals corresponding to a plurality of sampling instances by a level-crossing based sampling circuit. Moreover, the method further comprises the step of generating reset signals asynchronous to the event-based reset signals by a trigger circuit.

Therefore, the disclosure proposes additional resets for resetting the DAC in addition to the event-based resets correspond to each sampling instances, i.e. to each instances of sample generation, which can effectively minimize the requirement for a longer hold time of the DAC. Moreover, the offset requirements of the comparators are relaxed by the gain of the amplifier, which is shared by both comparators.

In some embodiments, the method further comprises the step of providing a first capacitor bank comprising a pair of parallel capacitors and switching arrangements in order to store the first reference level and providing a second capacitor bank comprising a pair of parallel capacitors and switching arrangements in order to store the second reference level.

In some embodiments, the method further comprises the step of operating the switching arrangements of the first capacitor bank and/or of the second capacitor bank for storing, by at least one capacitor of the pair of capacitors, a charge proportional to two least significant bit (LSB) in addition to an offset error of the amplifier, and for storing, by at least one capacitor of the pair of capacitors, a charge proportional to the offset error of the amplifier, and for storing, by each of the pair of capacitors, a charge proportional to one least significant bit (LSB). This effectively provides two references that are two LSB apart for the ADC to compare the input signal against the references.

BRIEF DESCRIPTION OF THE DRAWINGS

Example embodiments are now further explained with respect to the drawings by way of example only, and not for limitation.

DETAILED DESCRIPTION

Reference will now be made in detail to the embodiments, examples of which are illustrated in the accompanying drawings. However, the following embodiments may be variously modified and the range of the present disclosure is not limited by the following embodiments.

Figure 1A:
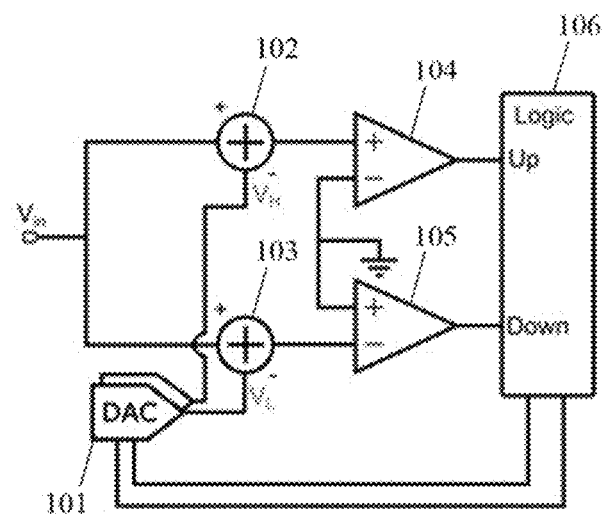
FIG. 1A shows a level-crossing based analog-to-digital converter, according to the prior art.
Figure 1B:
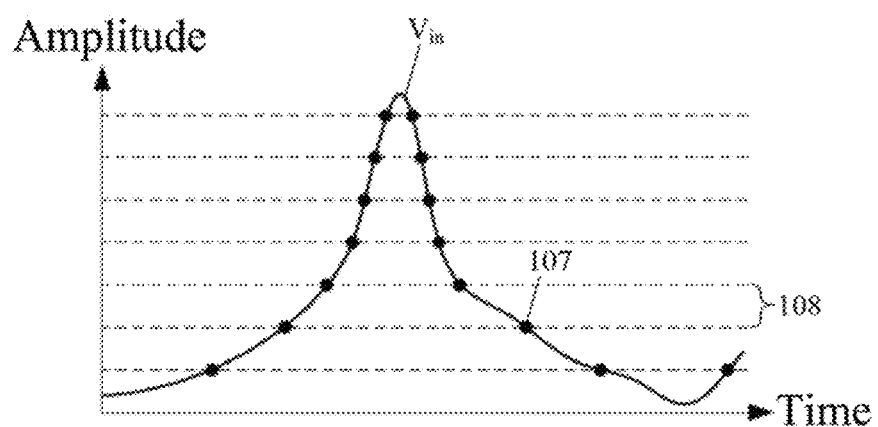
FIG. 1B shows sampling instances of the level-crossing based analog-to-digital converter of FIG. 1A, according to the prior art.

Along FIG. 1A and FIG. 1B, the operation of a conventional level-crossing based analog-to-digital converter is illustrated. Particularly, FIG. 1A shows a conventional level-crossing analog-to-digital converter (LC-ADC) that converts the analog signal $V_{in}$ into discrete samples at a numerous sampling instances. Specifically, the LC-ADC uses level-crossing detection to sample the analog signal $V_{in}$. The LC-ADC consists of two comparators 104,105, a digital-to-analog converter (DAC) 101 and a logic block 106 comprising an up/down counter. Two threshold levels $V_H$ and $V_L$ are set to identify the analog signal $V_{in}$. The threshold levels $V_H$ and $V_L$ are generated via the DAC 101 with a difference equal to the quantization step. Hence, in digital representation, the difference between $V_H$ and $V_L$ is equal to 2 least significant bit (LSB). The error 102 between $V_{in}$ and $V_H$ is fed to the comparator 104 and the error 103 between $V_{in}$ and $V_L$ is fed to the comparator 105 for comparison, for example.

The sampling instance or sampling occurs when $V_{in}$ is either higher than $V_H$ or lower than $V_L$. The logic block 106 then sets an increment signal or a decrement signal accordingly to activate the up/down counter, thereby incrementing or decrementing the counter output by 1 LSB. This further controls the DAC 101 whose generated signals $V_H$ and $V_L$ will be updated to keep tracking the analog signal $V_{in}$. On the other hand, as long as the analog signal $V_{in}$ is between $V_H$ and $V_L$, no changes occur on the up/down counter output or DAC 101 output, therefore no new samples are taken. The sampling instances are further shown in FIG. 1B, where the analog signal $V_{in}$ is sampled at different instances, e.g. 107, based on a sampling window 108 defined by the difference between $V_H$ and $V_L$.

However, the two comparators 104,105 have a different offset voltage, which degrades the SNDR and therefore may be kept small in order to achieve a high SNDR. One possible option is to add a foreground calibration, especially a resistive calibration DAC that can permanently hold the reference voltage. However, this may come with the cost of increased power consumption and may further increase the overall area based on the use of an additional clock. Moreover, such a calibration scheme is not able to counter offset drifts, which might hinder the performance in a real application.

Using a capacitive DAC for the reference voltage generation is the most common architecture for LC-ADC due to its small area and power consumption. The problem with a capacitive DAC however is that it is not possible to hold the charge indefinitely. Since the DAC 101 is only reset when the analog signal $V_{in}$ crosses $V_H$ or $V_L$, the DAC 101 is not reset when the analog signal $V_{in}$ changes slowly. This results in the leakage induced error increasing and therefore degrades the SNDR, especially for low frequencies.

Figure 2:
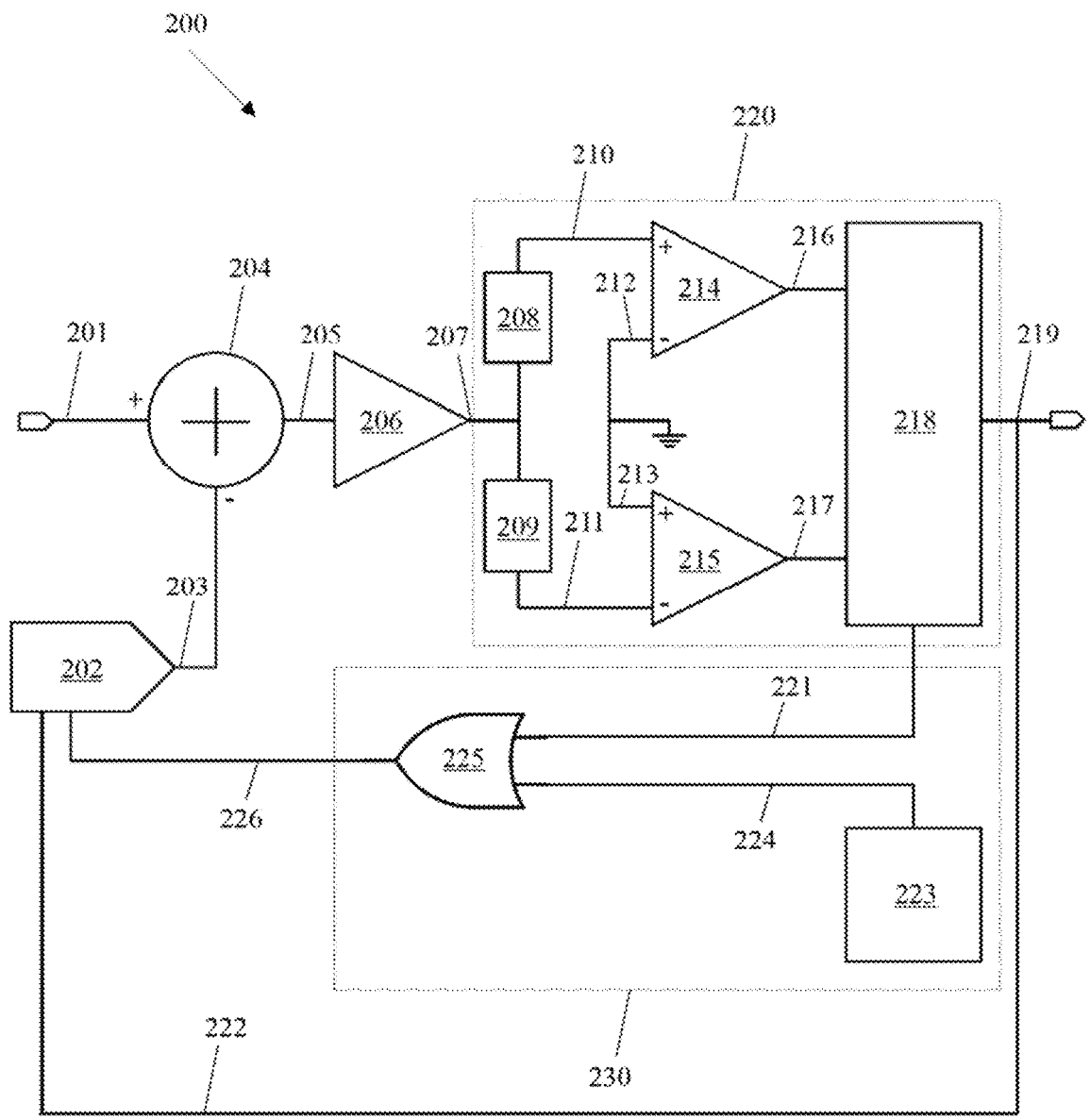
FIG. 2 shows a system, according to example embodiments.

In FIG. 2, a first example embodiment of the system 200 according to the first aspect of the disclosure is illustrated. The system 200 (can also be referred to as an analog-to-digital converter) comprises an analog input signal 201 to be converted into discrete samples while a reference signal 203 is generated by a digital-to-analog converter (DAC) 202 for domain conversion. The analog input signal 201 and the reference signal 203 are summed at a subtractor 204, which results in an error or difference signal (voltage, charge or current) 205 comprising a difference between the analog input signal 201 and the reference signal 203. The error signal 205 is fed to an amplifier or a pre-amplifier 206 that amplifies the error signal by the gain of the amplifier 206. Hence, the amplifier 206 may mitigate any signal loss due to the subtraction of the analog input signal 201 and the reference signal 203 at the subtractor 204.

The amplifier 206 provides a common node 207 at its output, which commonly shares the common node 207 with a first path 210 connecting to a non-inverting input of a first comparator 214 and a second path 211 connecting an inverting input of a second comparator 215. A first capacitor bank 208 is located at the first path 210 between the common node 207 and the non-inverting input of the first comparator 214. A second capacitor bank 209 is located at the second path 211 between the common node 207 and the inverting input of the second comparator 215. An inverting input of the first comparator 214 and a non-inverting input of the second comparator 215 are commonly connected to ground. The first capacitor bank 208 and the second capacitor bank 209 each comprise a pair of parallel capacitors (not shown) and switching arrangements, whose functionalities will be discussed in a later section of this description.

The output 216 of the first comparator 214 and the output 217 of the second comparator 215 are connected to a digital logic circuit 218. The digital logic circuit 218 includes an up/down counter and a timer (e.g. time-to-digital converter). The first capacitor bank 208, the second capacitor bank 209, the first comparator 214, the second comparator 215, and the digital logic circuit 218 collectively form a level-crossing based sampling circuit 220. The sampled output 219 from the digital logic circuit 218 is fed back to the DAC 202 over a feedback path 222 in order to generate the reference signal 203. The digital logic circuit 218 further outputs event-based reset signals 221 for each sampling instance or samples (i.e. up/down event) in order to reset the DAC 202.

The system further comprises a triggering arrangement 230 for resetting the DAC 202 in addition to the event-based reset signals 221. The triggering arrangement 230 includes a trigger circuit 223 that generates reset signals 224 asynchronous to the event-based reset signals 221. The triggering arrangement 230 further comprises a two-input OR gate 225 that inputs the event-based reset signals 221 from the digital logic circuit 218 and the trigger signals 224 from the trigger circuit 224, thereby outputting a trigger signal 226 whenever either one or both of the inputs of the OR gate 225 is high. It is to be noted that the OR gate 225 can be implemented with any logical combinations or gates as long as the output of the combinations is high when either one or both of the inputs are high.

Generally, the error signal 205 is amplified by the amplifier 206 and is further compared with a first reference level stored at the first capacitor bank 208 by the first comparator 214. In some embodiments, the first reference level gives the upper boundary of the comparison window. Similarly, the error signal 205 is amplified by the amplifier 206 and is further compared with a second reference level stored at the second capacitor bank 209 by the second comparator 215. In some embodiments, the second reference level gives the lower boundary of the comparison window. The storing method of the reference levels at the first capacitor bank 208 and at the second capacitor bank 209 will be discussed later in detail. The event-based reset signals 221 from the digital logic circuit 218 further change the reference signal level by shifting the first reference level and the second reference level via the DAC 202, thereby shifting the comparison window for subsequent comparisons.

In other words, the first comparator 214 and the second comparator 215 respectively compare the error signal 205 with respect to a fixed comparison window, i.e. in digital representation of 2 LSB, and toggles its output whenever it detects a level crossing. This result in the generation of respective sampling instances or samples and further toggles the up/down counter to generate an up or down event. Since the first comparator 214 and the second comparator 215 compare the error signal 205 instead of the input analog signal 201, the comparator common-mode range is reduced significantly and optimization of the comparators targeting at a specific reference level can be performed with ease. The related effects that result from comparator offset and distortion are thus reduced. More importantly, similar performance is achievable for the comparators with lower power consumption.

In addition, the amplifier 206 is shared by the first comparator 214 and the second comparator 215. Thus, any error made after the amplifier 206 is divided by the gain of the amplifier 206, which relaxes the offset requirement of the first comparator 214 and the second comparator 215.

When the first comparator 214 and/or the second comparator 215 detect a level crossing with respect to the comparison window, the output of the first comparator 214 and/or the output of the second comparator 215 toggle and the digital control circuit 218 updates the up/down counter in order to refresh the comparison window, thereby resetting the DAC 202. The up/down counter acts as a digital integrator and the time in between two sampling instances are recorded by the timer.

In addition to the up and/or down event-based reset signals 221, the trigger circuit 223 further generates asynchronous trigger signals 224, which are cumulatively operating on the DAC 202 to reset the DAC 202, even when there is no sampling instances recorded at the digital logic circuit 218.

Figure 3A:
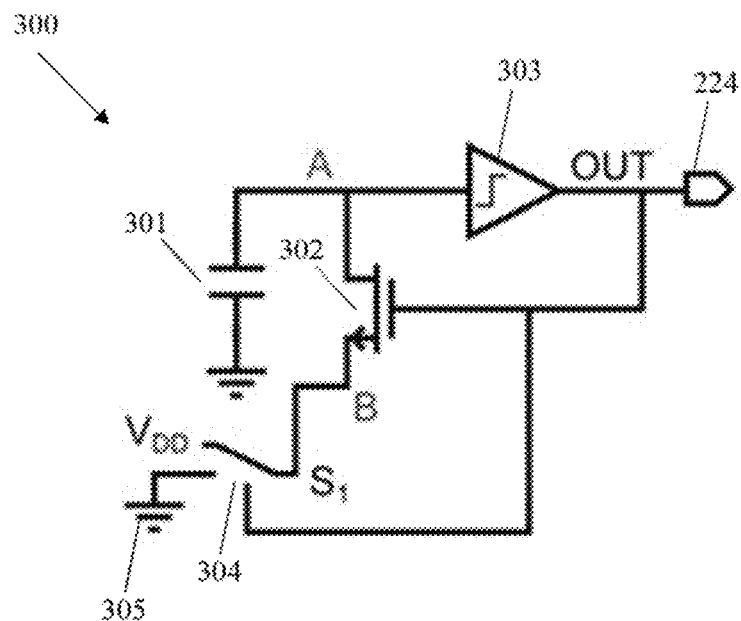
FIG. 3A shows a trigger circuit, according to example embodiments.
Figure 3B:
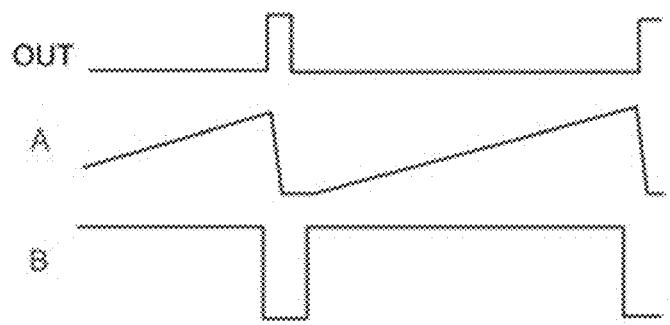
FIG. 3B shows operation stages of the trigger circuit of FIG. 3A, according to example embodiments.

Along FIG. 3A and FIG. 3B, a first example embodiment of the trigger circuit is illustrated. In particular, FIG. 3A shows the trigger circuit 300, which can be implemented as the trigger circuit 223 of FIG. 2. FIG. 3B shows operation stages of the trigger circuit 300.

In some embodiments, the DAC 202 is a capacitive DAC, and the trigger circuit 300 is may replicate the capacitive DAC. Since the leakage cannot be directly measured in the DAC 202, the replica circuit 300 is able to sense the leakage and further to act accordingly to mitigate the leakage. The trigger circuit 300 comprises a capacitor 301 connected to ground at one node and further provides a common port A to the other node. At the common node A, a NMOS switch 302 is coupled. Particularly, the drain of the NMOS switch is coupled to the common node A whereas the source of the NMOS switch is coupled to a node B. A second switch 304 is coupled to the node B that initially connects the node B to a bias voltage $V_{DD}$. A comparator 303 is coupled to the common node A and the output OUT of the comparator 303 is fed back to the gate of the NMOS switch 302 and further used to toggle the second switch 304 between the bias voltage $V_{DD}$ and ground 305.

During normal operation, the output OUT is low. Due to leakage through the NMOS switch 302, the voltage of the capacitor 301 rises. When the voltage of the capacitor 301 exceeds the trip point of the comparator 303, the output OUT goes high. This causes the NMOS switch 302 to turn on and the second switch 304 to toggle to ground 305. The capacitor 301 then discharges through the NMOS switch 302 and the voltage on the capacitor goes low again. This further sets the output OUT low and restarts the cycle.

The operation phases can be seen in FIG. 3B where the OUT is initially low and the voltage at A is rising, i.e. the charging state of the capacitor 301. The voltage at B is at $V_{DD}$. When the voltage at A rises to the trip point of the comparator 303, the comparator 303 output toggles, and thus OUT becomes high. At this point the capacitor 301 discharges and the voltage at A goes low as well as the voltage at B, since the latter is now connected to ground. This further sets the output OUT low and restarts the cycle. The OUT signals therefore represent the additional trigger signals 224 that are generated asynchronous to the event-based trigger signals 221 from the level-crossing based sampling circuit 220.

Figure 4A:
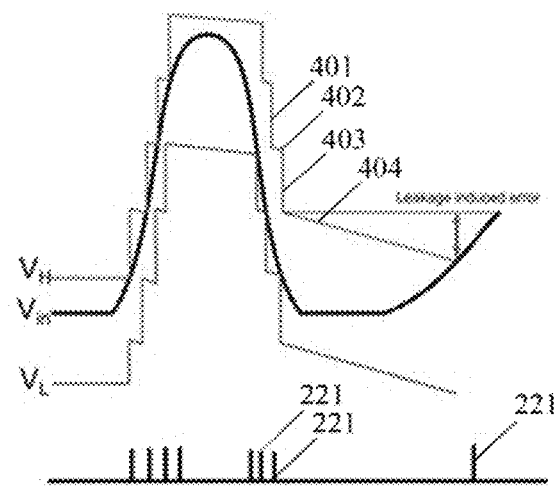
FIG. 4A shows the leakage induced error caused by a finite hold time of a digital-to-analog converter, according to example embodiments.
Figure 4B:
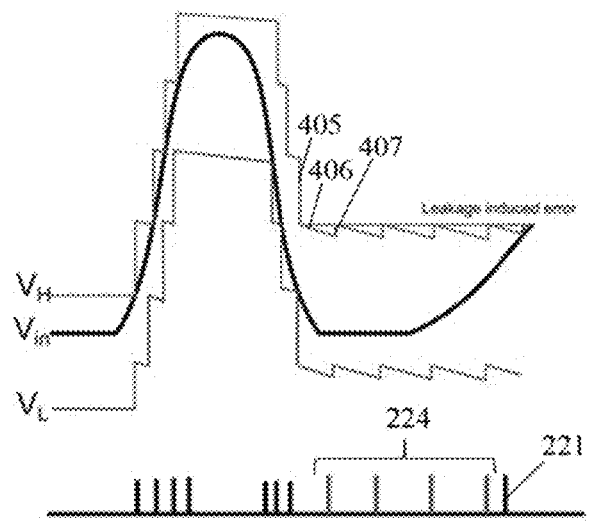
FIG. 4B shows the mitigation technique for the leakage induced error caused by a finite hold time of a digital-to-analog converter, according to example embodiments.

Along FIG. 4A and FIG. 4B, the leakage induced error of a digital-to-analog converter and the proposed mitigation technique are illustrated. Particularly, FIG. 4A shows the leakage induced error caused by a finite hold time of the digital-to-analog converter 202. As already mentioned before, a capacitive DAC is the most common architecture for the reference generation but suffers from a finite hold time. The signal $V_{in}$ represents the analog input signal 201 which is sampled along a sampling window provided by the upper boundary or first reference level $V_H$ and the lower boundary or second reference level $V_L$. The event-based reset signals 221 are shown as spikes respective to each up/down events, i.e. sampling instances.

When the signal $V_{in}$ changes sharply, more samples are generated, thereby generating more event-based reset signals 221. Hence, for fast changing signals, the drift in the reference is very short and therefore the leakage induced error is not significant. However, when the signal changes slowly, less number of samples are generated, thereby less number of event-based reset signals 221. This results in that the DAC reference drifts away and introduces a large leakage induced error. As it can be seen, the DAC 202 resets at point 401 and further drifts at 402 and further resets at 403. Since the time between crossings is short, the leakage induced error is not significant. However, at 404, the DAC drifts for a longer time that introduces a large leakage induced error.

FIG. 4B shows the proposed technique of having additional resets in order to mitigate the large leakage induced error in the DAC 202. Additional trigger signals 224 are generated along with the event-based reset signals 221, especially asynchronous to the event-based reset signals 221. Hence, when the signal $V_{in}$ is changing slowly, e.g. at 405 the DAC 202 resets and further drifts at 406, however, is not drifting anymore due to the additional resets 224. The DAC 202 resets at 407 instead. As a result, a portion of the leakage induced error is mitigated.

Figure 5A:
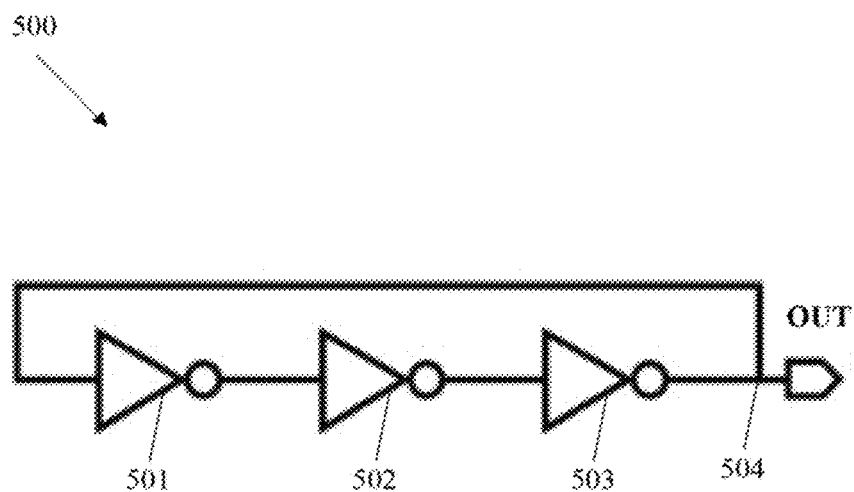
FIG. 5A shows a trigger circuit, according to example embodiments.
Figure 5B:
FIG. 5B shows output pulses of the trigger circuit of FIG. 5A, according to example embodiments.

Along Figure SA and FIG. 5B, a second example embodiment of the trigger circuit is illustrated. In particular, Figure SA shows the trigger circuit 500, which can be implemented as the trigger circuit 223 of FIG. 2. FIG. 5B shows the output of the trigger circuit 500.

The requirements for an additional trigger generating circuit may be relaxed since exact timing may not be required. Therefore, the trigger circuit 223 can be implemented as a current starved ring oscillator circuit 500 as shown in FIG. 5A. The ring oscillator 500 comprises a first inverter stage 501, a second inverter stage 502 and a third inverter stage 503, where the output 504 of the third inverter stage 503 is fed back to the first inverter stage 501. Although three inverter stages are illustrated herein, it is to be noted that any odd number of inverter stages can be implemented as long as the total propagation delay, i.e. the frequency of oscillation, meets the target specification. Hence, by connecting together any odd number of inverters to form a ring circuit, and by connecting the output of the ring straight back to the input of the ring, the circuit will continue to oscillate as a logic level "1" constantly rotates around the network. The oscillating outputs OUT can be seen in FIG. 5B, which represent the trigger signals 224 additionally generated to the event-based trigger signals 221.

Figure 6:
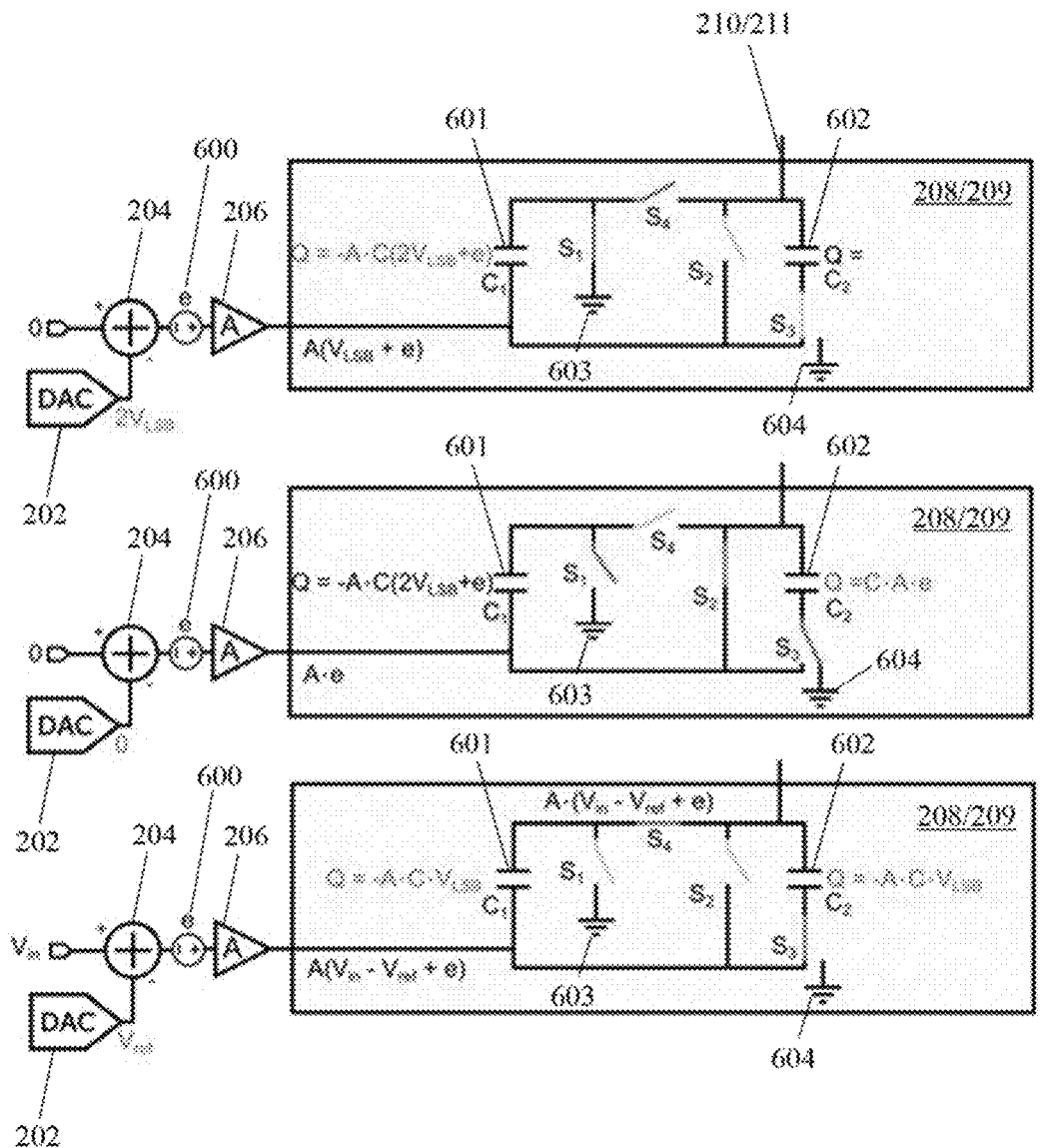
FIG. 6 shows switched-capacitor arrangements for storing the reference levels, according to example embodiments.

In FIG. 6, the first capacitor bank 208 and the second capacitor bank 209 are shown in detail. It is to be noted that the implementation is illustrated as a single-ended implementation and it is applicable to both capacitor banks 208, 209. Each capacitor bank comprises a pair of parallel capacitors 601 and 602, and at least four switches $S_1$, $S_2$, $S_3$ and $S_4$. The capacitors 601 and 602 are equally sized capacitors. Particularly, the amplifier 206 output is connected to one end of the capacitor 601 and the other end of the capacitor 601 is connected to the switches $S_1$ and $S_4$, where the switch $S_1$ can be toggled to ground 603. On the other hand, the switch $S_2$ is connected in parallel with the capacitor 602 to the switch $S_4$ and the switch $S_3$ is connected in series with the capacitor 602, where the switch $S_3$ can be toggled to ground 604. The first path 210 and/or the second path 211, as shown in FIG. 2, is coupled at the parallel junction between the switch $S_4$, the switch $S_2$ and the capacitor 602.

Along FIG. 6 the steps or phases for storing the reference level at the respective capacitor bank are illustrated in detail. During a first phase or step, $S_1$ is toggled to ground 603, $S_4$ is opened (i.e. no conduction through the switch), S2 is opened, and $S_3$ is closed (i.e. conduction through the switch). During this phase, no input analog signal 201 is inputted to the subtractor 204 and the DAC 202 generates reference voltage corresponding to the digital representation of 2 least significant bit (LSB). The amplifier 206 amplifies the 2 LSB along with an input referred offset 600 of the amplifier 206 by the gain A. Therefore, the output of the amplifier 206 during the first phase is given as:

$$V_{amp\_1st}=A\times(2V_{LSB}+e) \quad (1)$$

where, A is the amplifier gain, $V_{LSB}$ is the DAC reference voltage, and e is the input referred offset of the amplifier 206.

Since $S_4$ is opened and $S_1$ is grounded, the capacitor 601 will store the charge equivalent to the amplifier 206 output.

$$Q_{C1}=-A\times C\times(2V_{LSB}+e) \quad (2)$$

where, $Q_{C1}$ is the charge stored in the capacitor 601, C is the capacitance of the capacitor 601. The negative sign represents the change in the direction of the stored reference voltage, i.e. the polarity of the capacitor 601 is reversed.

During a second phase or step, $S_1$ is opened, $S_4$ is kept open, however $S_2$ is closed and $S_3$ is connected to the ground 604. During this phase no analog input signal as well as no reference signal are inputted to the subtractor 204. Therefore, the amplifier 206 amplifies only the input referred offset 600 by the gain A. Hence, the output of the amplifier 206 during the second phase is given as:

$$V_{amp\_2nd}=A\times e \quad (3)$$

Since $S_2$ is closed and $S_3$ is grounded, the capacitor 602 will store the charge equivalent to the amplifier 206 output.

$$Q_{C2}=A\times C\times e \quad (4)$$

where, $Q_{C2}$ is the charge stored in the capacitor 602, C is the capacitance of the capacitor 602, similar to the capacitor 601 as they are equally sized capacitors. Note that the signal is stored in the same direction of the amplifier output, therefore bearing no negative sign. Thus the polarity of the capacitor 602 is opposite to the polarity of the capacitor 601.

During a third phase or step, $S_1$ is opened, $S_4$ is closed, however $S_2$ is opened and $S_3$ is closed again. During this phase, the system performs the normal operation, i.e. the analog input signal 201 and the reference signal 203 are inputted to the subtractor 204. Thus, the amplifier 206 amplifies the difference or error signal along with the input referred offset 600. Hence, the output of the amplifier 206 during the third phase is given as:

$$V_{amp\_3rd}=A\times(V_{in}-V_{ref}+e) \quad (5)$$

Where, $V_{in}$ is the analog input signal 201 and $V_{ref}$ is the reference signal 203 generated from the DAC 202.

However, since $S_4$ is now closed, the capacitors 601 and 602 will share their charges as stored in the first phase and the second phase, respectively. This results in the cancellation of the input referred offset due to their opposite polarity. Moreover, each of the capacitor 601 and 602 now stores a charge equivalent to 1 LSB, which is given by:

$$Q_{C1}=Q_{C2}=-A\times C\times V_{LSB} \quad (6)$$

Therefore, the respective comparators compare the output of the amplifier 206 with respect to the reference level correspondingly stored at the respective capacitor banks 208, 209. In some embodiments, the digital logic circuit 218 provides the control signals used to toggle the switches $S_1$, $S_2$, $S_3$, and $S_4$, which can be generated from a sequence of logic based on the different phases described above and/or can be pre-programmed and further can be executed before and during the signal conversion.

Figure 7:
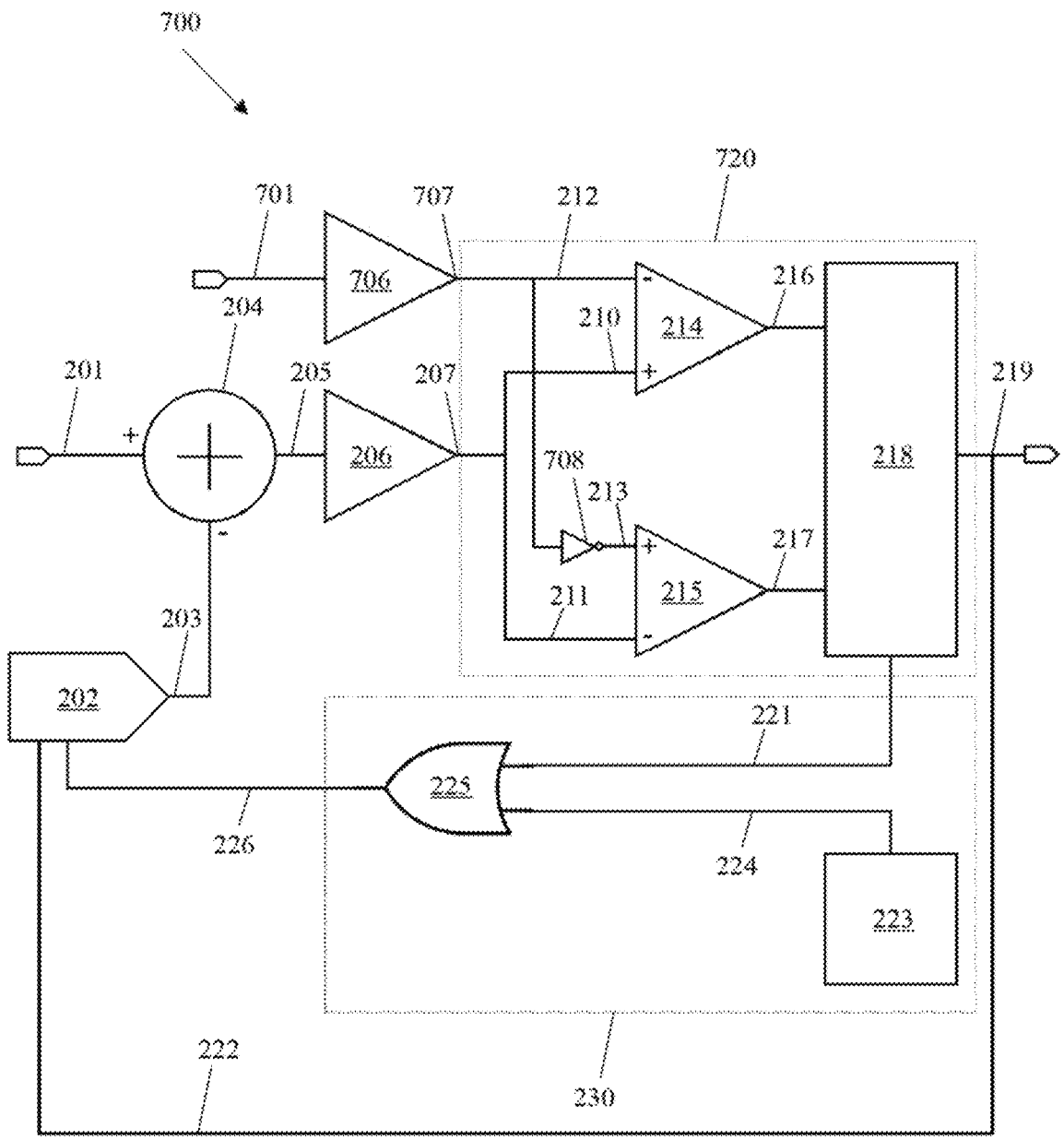
FIG. 7 shows a system, according to example embodiments.

In FIG. 7, a second example embodiment of the system 700 according to the first aspect of the disclosure is illustrated. The system 700 differs from the system 200 in that the reference levels are separately inputted through an additional amplifier as opposed to input via a shared amplifier and to store the reference levels in two capacitor banks.

The system 700 comprises the analog input signal 201 to be converted into discrete samples while the reference signal 203 is generated by the DAC 202 for domain conversion. The analog input signal 201 and the reference signal 203 are summed at the subtractor 204, which results in the error or difference signal (voltage, charge or current) 205 comprising a difference between the analog input signal 201 and the reference signal 203. The error signal 205 is fed to the amplifier or the pre-amplifier 206 that amplifies the error signal by the gain of the amplifier 206.

The output of the amplifier 206 is fed to the non-inverting input of the first comparator 214 and further to the inverting input of the second comparator 215. In addition, a reference level 701 is inputted to an additional amplifier 706, where the output of the amplifier 706 is fed to the inverting input of the first comparator and further to the non-inverting input of the second comparator, however the latter input is inverted by an inverter 708. Hence, the amplifier 206 provides the error signal 205 whereas the amplifier 706 provides the reference levels for the comparison window. It is to be noted that the amplifier 706 is selected so as to match the gain of the amplifier 206. The level-crossing based sampling as well as the additional trigger generation as described along FIG. 2 are analogously performed in the system 700, and are not repeated herein.

Figure 8:
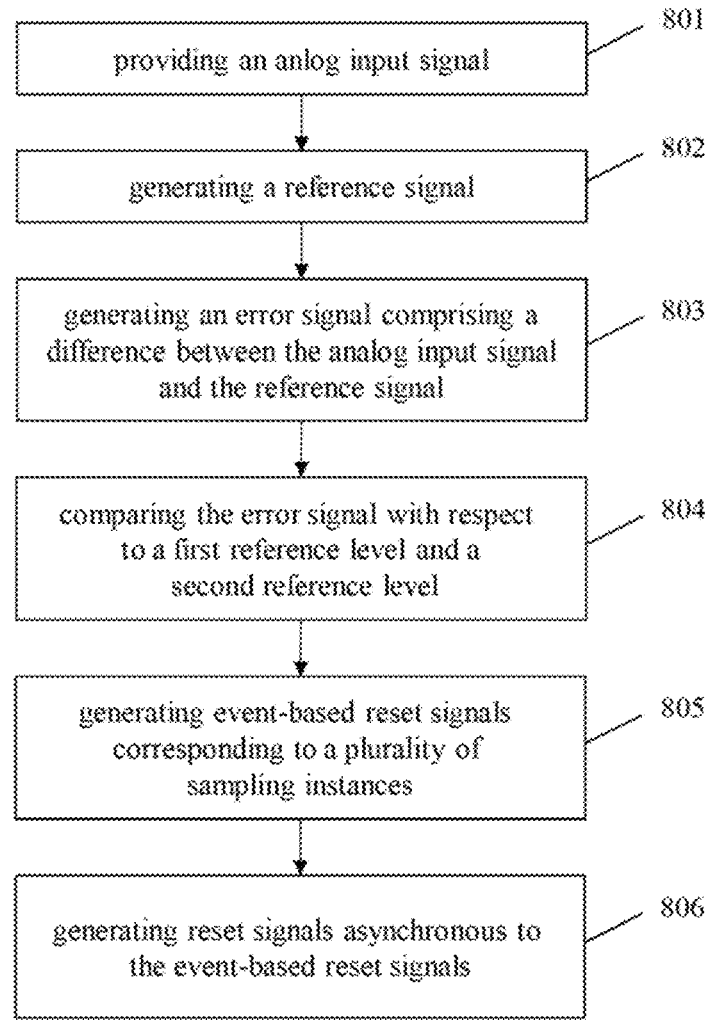
FIG. 8 shows a method, according to example embodiments.

In FIG. 8, an example embodiment of the method 800 according to the second aspect of the disclosure is illustrated. In a first step 801, an analog input signal is provided. In a second step 802, a reference signal is generated. In a third step 803, an error signal is generated that comprises a difference between the analog input signal and the reference signal. In a fourth step 804, the error signal is compared with respect to a first reference level and to a second reference level. In a fifth step 805, event-based reset signals are generated corresponding to a plurality of sampling instances. In a sixth step 806, additional reset signals asynchronous to the event-based reset signals are generated.

The embodiments of the present disclosure can be implemented by hardware, software, or any combination thereof. Various embodiments may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Although example embodiments have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations for any given or particular application.

What is claimed is:

1. A system for analog-to-digital signal conversion comprising:
   an analog input signal;
   a digital-to-analog converter configured to generate a reference signal;
   an amplifier configured to amplify an error signal comprising a difference between the analog input signal and the reference signal;
   a level-crossing based sampling circuit comprising a first comparator configured to compare the error signal with respect to a first reference level, and a second comparator configured to compare the error signal with respect to a second reference level, thereby generating event-based reset signals corresponding to a plurality of sampling instances in order to reset the digital-to-analog converter and further to shift the first reference level and the second reference level through the digital-to-analog converter; and
   a trigger circuit configured to generate reset signals asynchronous to the event-based reset signals in order to reset the digital-to-analog converter.

2. The system according to claim 1,
   wherein the level-crossing based sampling circuit further comprises a digital logic circuit configured to generate an amplitude and a time stamp corresponding to each of the plurality of sampling instances.

3. The system according to claim 2,
   wherein the digital logic circuit is further configured to feedback the amplitude corresponding to each of the plurality of sampling instances to the digital-to-analog converter in order to generate the reference signal.

4. The system according to claim 1,
   wherein the digital-to-analog convener is a capacitive charge transfer digital-to-analog converter or a switched capacitor based digital-to-analog converter.

5. The system according to claim 4,
   wherein the trigger circuit comprises a switched capacitor arrangement in order to replicate the digital-to-analog converter.

6. The system according to claim 1,
   wherein the level-crossing based sampling circuit further comprises a first capacitor bank coupled between a common node downstream to the amplifier and the first comparator, and
   wherein the first capacitor bank is configured to store the first reference level based on the reference signal.

7. The system according to claim 6,
   wherein the level-crossing based sampling circuit further comprises a second capacitor bank coupled between the common node downstream to the amplifier and the second comparator, and
   wherein the second capacitor bank is configured to store the second reference level based on the reference signal.

8. The system according to claim 7,
   wherein the first capacitor bank or the second capacitor bank comprises a pair of parallel capacitors and switching arrangements, and
   wherein the switching arrangements are configured to be operable such that at least one capacitor of the pair of parallel capacitors stores a charge proportional to two least significant bit (LSB) in addition to an offset error of the amplifier.

9. The system according to claim 8,
   wherein the switching arrangements are further configured to be operable such that at least one capacitor of the pair of parallel capacitors stores a charge proportional to the offset error of the amplifier.

10. The system according to claim 8,
    wherein the switching arrangements are further configured to be operable such that the pair of parallel capacitors each stores a charge proportional to one least significant bit (LSB).

11. The system according to claim 8,
    wherein the pair of parallel capacitors of the first capacitor bank or the second capacitor bank are equal in dimension or are identical parallel plate capacitors.

12. The system according to claim 8,
    wherein the level-crossing based sampling circuit further comprises a digital logic circuit configured to generate an amplitude and a time stamp corresponding to each of the plurality of sampling instances, and
    wherein the digital logic circuit is further configured to generate control signals for the switching arrangements of the first capacitor bank or the second capacitor bank.

13. A method for analog-to-digital signal conversion comprising:
    providing an analog input signal;
    generating a reference signal by a digital-to-analog converter;
    generating an error signal comprising a difference between the analog input signal and the reference signal;
    amplifying the error signal by an amplifier;
    comparing the error signal with respect to a first reference level and a second reference level;
    generating event-based reset signals corresponding to a plurality of sampling instances by a level-crossing based sampling circuit; and
    generating reset signals asynchronous to the event-based reset signals by a trigger circuit.

14. The method according to claim 13,
    wherein the method further comprises providing:
    a first capacitor bank comprising a pair of parallel capacitors and switching arrangements in order to store the first reference level; and
    a second capacitor bank comprising a pair of parallel capacitors and switching arrangements in order to store the second reference level.

15. The method according to claim 14,
    wherein the method further comprises operating the switching arrangements of the first capacitor bank or of the second capacitor bank for:
    storing, by at least one capacitor of the pair of parallel capacitors, a charge proportional to two least significant bit (LSB) in addition to an offset error of the amplifier;
    storing, by at least one capacitor of the pair of parallel capacitors, a charge proportional to the offset error of the amplifier; and
    storing, by each of the pair of parallel capacitors, a charge proportional to one least significant bit (LSB).

16. The method according to claim 14, wherein the pair of parallel capacitors of the first capacitor bank or the second capacitor bank are equal in dimension or are identical parallel plate capacitors.

17. The method according to claim 13, wherein the level-crossing based sampling circuit comprises a digital logic circuit configured to generate an amplitude and a time stamp corresponding to each of the plurality of sampling instances.

18. The method according to claim 17, wherein the digital logic circuit is further configured to feedback the amplitude corresponding to each of the plurality of sampling instances to the digital-to-analog converter in order to generate the reference signal.

19. The method according to claim 13, wherein the digital-to-analog converter is a capacitive charge transfer digital-to-analog converter or a switched capacitor based digital-to-analog converter.

20. The method according to claim 19, wherein the trigger circuit comprises a switched capacitor arrangement in order to replicate the digital-to-analog converter.

\* \* \* \* \*